(12) United States Patent
Uejima et al.

(10) Patent No.: US 9,112,473 B2
(45) Date of Patent: Aug. 18, 2015

(54) BRANCHING CIRCUIT AND RF CIRCUIT MODULE

(71) Applicant: Murata Manufacturing Co., Ltd., Nagaokakyo-shi, Kyoto-fu (JP)

(72) Inventors: Takanori Uejima, Nagaokakyo (JP); Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/309,916

(22) Filed: Jun. 20, 2014

(65) Prior Publication Data

US 2014/0300432 A1 Oct. 9, 2014

Related U.S. Application Data

(63) Continuation of application No. PCT/JP2012/081878, filed on Dec. 10, 2012.

(30) Foreign Application Priority Data

Dec. 27, 2011 (JP) ................................. 2011-284815

(51) Int. Cl.
*H03H 7/46* (2006.01)
*H03H 7/00* (2006.01)
(Continued)

(52) U.S. Cl.
CPC . *H03H 7/00* (2013.01); *H03H 7/46* (2013.01); *H04B 1/525* (2013.01); *H03H 7/19* (2013.01)

(58) Field of Classification Search
CPC ............. H03H 7/00; H03H 7/46; H03H 7/19; H03H 7/20; H03H 7/21; H04B 1/525
USPC ................... 333/126, 129, 132, 133
See application file for complete search history.

(56) References Cited

U.S. PATENT DOCUMENTS

2007/0046395 A1 3/2007 Tsutsumi et al.
2008/0279122 A1 11/2008 Fukuda et al.
(Continued)

FOREIGN PATENT DOCUMENTS

JP 08-079126 A 3/1996
JP 2007-060411 A 3/2007
(Continued)

OTHER PUBLICATIONS

Official Communication issued in International Patent Application No. PCT/JP2012/081878, mailed on Jan. 22, 2013.

*Primary Examiner* — Benny Lee
*Assistant Examiner* — Kimberly Glenn
(74) *Attorney, Agent, or Firm* — Keating & Bennett, LLP

(57) ABSTRACT

A branching circuit includes a transmission filter and a reception filter. The transmission filter is connected between a transmission signal input terminal and an antenna connection terminal. The reception filter is connected between the antenna connection terminal and a reception signal output terminal in series together with a first phase shift circuit and a second phase shift circuit. A first amplitude adjustment circuit and a second amplitude adjustment circuit are connected in series between the antenna connection terminal and the reception signal output terminal. A junction point between the first amplitude adjustment circuit and the second amplitude adjustment circuit is connected to a junction point between the first phase shift circuit and the second phase shift circuit. The first and second phase shift circuits adjust the phase of a transmission signal that leaks to the reception side and that is to be canceled out. The first and second amplitude adjustment circuits adjust the amplitude of the transmission signal that is to be canceled out.

16 Claims, 4 Drawing Sheets

(51) Int. Cl.
*H04B 1/525* (2015.01)
*H03H 7/19* (2006.01)

(56) References Cited

U.S. PATENT DOCUMENTS

2010/0102897 A1 4/2010 Moritsuka et al.
2010/0150075 A1 6/2010 Inoue et al.
2010/0244979 A1 9/2010 Matsuda et al.
2011/0254639 A1* 10/2011 Tsutsumi et al. ............ 333/132

FOREIGN PATENT DOCUMENTS

| | | |
|---|---|---|
| JP | 2008-278417 A | 11/2008 |
| JP | 2010-154437 A | 7/2010 |
| JP | 2011-171922 A | 9/2011 |
| WO | 2009/025106 A1 | 2/2009 |

* cited by examiner

BRANCHING CIRCUIT AND RF CIRCUIT MODULE

BACKGROUND OF THE INVENTION

1. Field of the Invention

The present invention relates to a branching circuit that branches and transfers, from a signal line in common to a plurality of communication signals having different frequency bands, the communication signals to signal lines are different for each of the communication signals, and also relates to an RF circuit module including the branching circuit.

2. Description of the Related Art

Hitherto, a branching circuit has been widely used as a circuit element to perform transmission and reception of one communication signal through a single antenna in common. A branching circuit has also been used in the case of receiving reception signals as a plurality of communication signals and transmitting transmission signals as a plurality of communication signals through a single antenna.

For example, when a branching circuit is used to perform transmission and reception of one communication signal through a single antenna in common, a transmission signal input terminal, a reception signal output terminal, and an antenna connection terminal are disposed in the branching circuit. The branching circuit is designed to output the transmission signal, which has been input through the transmission signal input terminal, from the antenna connection terminal without outputting the transmission signal from the reception signal output terminal. Furthermore, the branching circuit is designed to output the reception signal, which has been input through the antenna connection terminal, from the reception signal output terminal without outputting the reception signal from the transmission signal input terminal.

To realize the above-described branching process, the branching circuit includes, for example, a transmission-side filter connected between the antenna connection terminal and the transmission signal input terminal, and a reception-side filter connected between the antenna connection terminal and the reception signal output terminal, as disclosed in Japanese Unexamined Patent Application Publication No. 2007-60411. The transmission-side filter is configured such that a frequency band of the transmission signal falls within a pass band of the transmission-side filter, and such that a frequency band of the reception signal falls within an attenuation band of the transmission-side filter. The reception-side filter is configured such that a frequency band of the reception signal falls within a pass band of the reception-side filter, and such that a frequency band of the transmission signal falls within an attenuation band of the reception-side filter.

At present, an RF circuit module including the above-described branching circuit is constituted by a multilayer body in which conductor patterns for realizing a predetermined circuit are formed, and by circuit elements mounted on the multilayer body.

In the branching circuit, there is a portion where conductor patterns through which the transmission signal is transferred and conductor patterns through which the reception signal is transferred are connected to each other. Hence the transmission signal tends to come into the reception side, and the reception signal tends to come into the transmission side. Usually, as described above, the transmission-side filter attenuates the reception signal, and the reception-side filter attenuates the transmission signal.

With downsizing of the RF circuit module, however, the conductor patterns on the transmission side and the conductor patterns on the reception side are positioned closer to each other and are apt to more easily cause coupling therebetween. In addition, power of the transmission signal is large. Accordingly, a portion of the transmission signal may leak to the reception signal output terminal. This gives rise to, for example, a problem that characteristics of the reception circuit in a downstream stage degrade.

SUMMARY OF THE INVENTION

Preferred embodiments of the present invention provide a branching circuit capable of ensuring isolation between terminals through which different communication signals are input and output, particularly isolation between a transmission signal input terminal and a reception signal output terminal, and an RF circuit module including the branching circuit.

According to a preferred embodiment of the present invention, a branching circuit includes a first filter connected between a first input/output terminal and a third input/output terminal and having a pass band that corresponds to a frequency band of a first communication signal, and a second filter connected between a second input/output terminal and the third input/output terminal and having a pass band that corresponds to a frequency band of a second communication signal, the pass band of the first filter and the pass band of the second filter being different from each other. The branching circuit further includes a phase shift circuit connected in series to a terminal of the second filter at a side closer to the second input/output terminal, and an amplitude adjustment circuit connected between a terminal of the second filter at a side closer to the third input/output terminal and a terminal of the phase shift circuit at a side closer to the second input/output terminal in parallel to the second filter and the phase shift circuit. The phase shift circuit is configured to rotate a phase of a fundamental component and/or a predetermined harmonic component of the first communication signal leaking from the second filter to be reversed relative to a phase of the first communication signal having passed through the amplitude adjustment circuit at a junction point between the amplitude adjustment circuit and the phase shift circuit. The amplitude adjustment circuit is configured to execute amplitude adjustment such that an amplitude of the first communication signal output from the amplitude adjustment circuit and an amplitude of the first communication signal output from the phase shift circuit are matched with each other at the junction point between the amplitude adjustment circuit and the phase shift circuit.

With the features described above, the amplitude of the first communication signal through the second filter and the phase shift circuit and the amplitude of the first communication signal through the amplitude adjustment circuit are cancelled out. At that time, the fundamental component and the predetermined harmonic component of the first communication signal are both cancelled out. As a result, the fundamental component and the predetermined harmonic component of the first communication signal are prevented from being output to the second input/output terminal.

In the branching circuit according to a preferred embodiment of the present invention, preferably, the phase shift circuit includes a first phase shift circuit configured to adjust the phase of the fundamental component, and a second phase shift circuit configured to adjust the phase of the predetermined harmonic component, the first phase shift circuit and the second phase shift circuit being connected in series.

With the features described above, the first phase shift circuit and the second phase shift circuit are configured to separately set respective amounts of the phase adjustments for the different frequency components. Accordingly, the setting of the phase adjustment for each phase shift circuit is performed accurately and easily.

In the branching circuit according to a preferred embodiment of the present invention, preferably, the amplitude adjustment circuit includes a first amplitude adjustment circuit and a second amplitude adjustment circuit, which are connected in series.

In the branching circuit according to another preferred embodiment of the present invention, preferably, the amplitude adjustment circuit includes a first amplitude adjustment circuit and a second amplitude adjustment circuit, which are connected in parallel.

With the features described above, the first amplitude adjustment circuit and the second amplitude adjustment circuit are configured to separately set respective amounts of the amplitude adjustments for the different frequency components. Accordingly, the setting of the amplitude adjustment for each amplitude adjustment circuit is performed accurately and easily.

The branching circuit according to a preferred embodiment of the present invention preferably further includes a third phase shift circuit connected between the first filter and the first input/output terminal, and a third amplitude adjustment circuit connected in series between a terminal of the third phase shift circuit at a side closer to the first input/output terminal and a terminal of the first filter at a side closer to the third input/output terminal.

With the features described above, unwanted leaking of the communication signal on the first filter side is significantly reduced or prevented. For example, the second communication signal is prevented from being output to the first input/output terminal. Furthermore, an unnecessary wave component of the first communication signal input from the first input/output terminal and passing through the first filter is significantly reduced or prevented from being output to the third input/output terminal or to the second input/output terminal.

The branching circuit according to a preferred embodiment of the present invention is preferably configured as follows. The branching circuit further includes a third filter connected between a fourth input/output terminal and a sixth input/output terminal and having a pass band that corresponds to a frequency band of a third communication signal, a fourth filter connected between a fifth input/output terminal and the sixth input/output terminal and having a pass band that corresponds to a frequency band of a fourth communication signal, and a fourth phase shift circuit connected between the fourth filter and the fifth input/output terminal. The third input/output terminal and the sixth input/output terminal are connected directly or indirectly. A terminal of the amplitude adjustment circuit at a side closer to the second input/output terminal is connected to a predetermined point between the fourth phase shift circuit and the fifth input/output terminal. The fourth phase shift circuit is configured to rotate a phase of the first communication signal leaking from the fourth filter to be reversed relative to the phase of the first communication signal having passed through the amplitude adjustment circuit at the predetermined point between the fourth phase shift circuit and the fifth input/output terminal. The amplitude adjustment circuit executes amplitude adjustment such that the amplitude of the first communication signal output from the amplitude adjustment circuit and an amplitude of the first communication signal output from the fourth phase shift circuit are matched with each other at the predetermined point between the fourth phase shift circuit and the fifth input/output terminal.

With the features described above, the first communication signal is significantly reduced or prevented from being output to not only the second input/output terminal, but also the fifth input/output terminal.

The branching circuit according to a preferred embodiment of the present invention may further include a switch that selectively connects the third input/output terminal and the sixth input/output terminal to a seventh input/output terminal.

The feature described above represents a further practical example of the branching circuit.

The branching circuit according to a preferred embodiment of the present invention preferably is configured as follows. The branching circuit includes a first filter connected between a first input/output terminal and a third input/output terminal and having a pass band that corresponds to a frequency band of a first communication signal, and a second filter connected between a second input/output terminal and the third input/output terminal and having a pass band that corresponds to a frequency band of a second communication signal. The pass band of the first filter and the pass band of the second filter are set different from each other.

The branching circuit further includes a first phase shift circuit and a second phase shift circuit connected in series to a terminal of the second filter at a side closer to the second input/output terminal, and a first amplitude adjustment circuit and a second amplitude adjustment circuit connected in series to each other and connected between a terminal of the second filter at a side closer to the third input/output terminal and a terminal of the second phase shift circuit at a side closer to the second input/output terminal in parallel to the second filter.

A junction point between the first amplitude adjustment circuit and the second amplitude adjustment circuit is connected to a junction point between the first phase shift circuit and the second phase shift circuit. The first phase shift circuit is configured to rotate a phase of at least a fundamental component of the first communication signal leaking from the second filter to be reversed relative to a phase of the first communication signal having passed through the first amplitude adjustment circuit at a junction point between the first amplitude adjustment circuit and the first phase shift circuit. The second phase shift circuit is configured to rotate a phase of a predetermined harmonic component of the first communication signal leaking from the second filter to be reversed relative to a phase of the first communication signal having passed through the second amplitude adjustment circuit at a junction point between the second amplitude adjustment circuit and the second phase shift circuit. The first amplitude adjustment circuit is configured to execute amplitude adjustment such that an amplitude of the fundamental component of the first communication signal output from the first amplitude adjustment circuit and an amplitude of the fundamental component of the first communication signal output from the first phase shift circuit are matched with each other at the junction point between the first amplitude adjustment circuit and the first phase shift circuit. The second amplitude adjustment circuit is configured to execute amplitude adjustment such that an amplitude of the predetermined harmonic component of the first communication signal output from the second amplitude adjustment circuit and an amplitude of the predetermined harmonic component of the first communication signal output from the second phase shift circuit are matched with each other at the junction point between the second amplitude adjustment circuit and the second phase shift circuit.

The features described above represent a practical circuit configuration when the phase shift circuit and the amplitude adjustment circuit are each disposed in multiple stages. With the above-described features, the fundamental component of the first communication signal having leaked from the second filter toward the second input/output terminal is significantly reduced or prevented by the first phase shift circuit and the first amplitude adjustment circuit. Moreover, the predetermined harmonic component of the first communication signal having leaked from the second filter toward the second input/output terminal is significantly reduced or prevented by the second phase shift circuit and the second amplitude adjustment circuit.

The branching circuit according to a preferred embodiment of the present invention preferably is configured as follows. The branching circuit includes a first filter connected between a first input/output terminal and a third input/output terminal and having a pass band that corresponds to a frequency band of a first communication signal, and a second filter connected between a second input/output terminal and the third input/output terminal and having a pass band that corresponds to a frequency band of a second communication signal. The pass band of the first filter and the pass band of the second filter are set different from each other.

The branching circuit further includes a first phase shift circuit and a second phase shift circuit connected in series to a terminal of the second filter at a side closer to the second input/output terminal, a first amplitude adjustment circuit connected in series between a terminal of the second filter at a side closer to the third input/output terminal and a terminal of the first phase shift circuit at a side closer to the second phase shift circuit, and a second amplitude adjustment circuit connected in series between the terminal of the second filter at a side closer to the third input/output terminal and a terminal of the second phase shift circuit at a side closer to the second input/output terminal.

The first phase shift circuit is configured to rotate a phase of at least a fundamental component of the first communication signal leaking from the second filter to be reversed relative to a phase of the first communication signal having passed through the first amplitude adjustment circuit at a junction point between the first amplitude adjustment circuit and the first phase shift circuit. The second phase shift circuit is configured to rotate a phase of a predetermined harmonic component of the first communication signal leaking from the second filter to be reversed relative to a phase of the first communication signal having passed through the second amplitude adjustment circuit at a junction point between the second amplitude adjustment circuit and the second phase shift circuit. The first amplitude adjustment circuit is configured to execute amplitude adjustment such that an amplitude of the fundamental component of the first communication signal output from the first amplitude adjustment circuit and an amplitude of the fundamental component of the first communication signal output from the first phase shift circuit are matched with each other at the junction point between the first amplitude adjustment circuit and the first phase shift circuit. The second amplitude adjustment circuit is configured to execute amplitude adjustment such that an amplitude of the predetermined harmonic component of the first communication signal output from the second amplitude adjustment circuit and an amplitude of the predetermined harmonic component of the first communication signal output from the second phase shift circuit are matched with each other at the junction point between the second amplitude adjustment circuit and the second phase shift circuit.

The features described above represent a practical circuit configuration when the phase shift circuit and the amplitude adjustment circuit are each disposed in multiple stages. With the above-described features, the fundamental component of the first communication signal having leaked from the second filter toward the second input/output terminal is significantly reduced or prevented by the first phase shift circuit and the first amplitude adjustment circuit. Moreover, the predetermined harmonic component of the first communication signal having leaked from the second filter toward the second input/output terminal is significantly reduced or prevented by the second phase shift circuit and the second amplitude adjustment circuit. In addition, with the above-described features, since the first and second amplitude adjustment circuits are connected in parallel to a route passing through the second filter, the amplitudes of the fundamental component and the predetermined harmonic component are adjusted independently of each other. As a result, the amounts of the amplitude adjustment are set more accurately and more easily.

According to a preferred embodiment of the present invention, the above-described circuit configuration of the branching circuit preferably is realized with an RF circuit module including a multilayer body that includes conductor patterns therein, and a mount-type component mounted to the multilayer body. The amplitude adjustment circuit and the phase shift circuit are each defined by the mount-type component or the conductor patterns in the multilayer body.

Furthermore, according to another preferred embodiment of the present invention, the above-described circuit configuration of the branching circuit preferably is realized with an RF circuit module including a multilayer body that includes conductor patterns therein, and a mount-type component mounted to the multilayer body. The first amplitude adjustment circuit, the second amplitude adjustment circuit, the first phase shift circuit, and the second phase shift circuit are each defined by the mount-type component or the conductor patterns in the multilayer body.

With the features described above, the circuit configured to execute the amplitude adjustment and the circuit configured to execute the phase adjustment can be formed integrally with the filters. Hence, the RF circuit module including the branching function is reduced in size and height.

According to various preferred embodiments of the present invention, isolation between terminals of the branching circuit through which different communication signals are input and output is held in a highly reliable state. In particular, isolation between the transmission signal input terminal and the reception signal output terminal is held in a highly reliable state.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A branching circuit according to preferred embodiments of the present invention will be described below with reference to the drawings.

Figure 1:
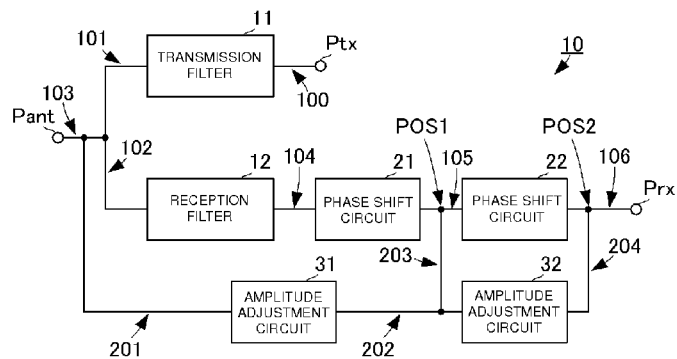
FIG. 1 is a circuit block diagram of a branching circuit according to a first preferred embodiment of the present invention.

FIG. 1 is a circuit block diagram of the branching circuit 10 according to a first preferred embodiment of the present invention.

The branching circuit 10 preferably includes a transmission signal input terminal Ptx that corresponds to a "first input/output terminal", a reception signal output terminal Prx that corresponds to a "second input/output terminal", and an antenna connection terminal Pant that corresponds to a "third input/output terminal". The branching circuit 10 further includes a transmission filter 11 that corresponds to a "first filter", and a reception filter 12 that corresponds to a "second filter". The branching circuit 10 still further includes a first phase shift circuit 21, a second phase shift circuit 22, a first amplitude adjustment circuit 31, and a second amplitude adjustment circuit 32. The first phase shift circuit 21 and the second phase shift circuit 22 constitute a "phase shift circuit". The first amplitude adjustment circuit 31 and the second amplitude adjustment circuit 32 constitute an "amplitude adjustment circuit".

The transmission signal input terminal Ptx is connected to a first terminal of the transmission filter 11 by a connection conductor 100. A second terminal of the transmission filter 11 is connected to the antenna connection terminal Pant by connection conductors 101 and 103.

A junction point between the connection conductor 101 and the connection conductor 103 is connected to a first terminal of the reception filter 12 by a connection conductor 102. A second terminal of the reception filter 12 is connected to a first terminal of the first phase shift circuit 21 by a connection conductor 104. A second terminal of the first phase shift circuit is connected to a first terminal of the second phase shift circuit 22 by a connection conductor 105. A second terminal of the second phase shift circuit 22 is connected to the reception signal output terminal Prx by a connection conductor 106.

The connection conductor 103 is connected at its predetermined point to a first terminal of the first amplitude adjustment circuit 31 by a connection conductor 201. A second terminal of the first amplitude adjustment circuit 31 is connected to a first terminal of the second amplitude adjustment circuit 32 by a connection conductor 202. A second terminal of the second amplitude adjustment circuit 32 is connected to a predetermined point POS2 in the connection conductor 106 by a connection conductor 204. The connection conductor 202 is connected at its predetermined point to a predetermined point POS1 in the connection conductor 105 by a connection conductor 203.

The transmission filter 11 preferably is configured, for example, by connecting a plurality of SAW filters in series or in parallel. The transmission filter 11 is configured such that a frequency band of the transmission signal (corresponding to a "first communication signal") falls within a pass band of the transmission-side filter 11, and that a frequency band of the reception signal (corresponding to a "second communication signal") falls within an attenuation band of the transmission-side filter 11.

The reception filter 12 is also preferably configured, for example, by connecting a plurality of SAW filters in series or in parallel. The reception filter 12 is configured such that the frequency band of the reception signal falls within a pass band of the reception filter 12, and such that the frequency band of the transmission signal falls within an attenuation band of the reception filter 12.

In the branching circuit 10 having the above-described configuration, the transmission signal and the reception signal are basically transferred as follows.

The transmission signal input from the transmission signal input terminal Ptx is output from the antenna connection terminal Pant through the transmission filter 11. Unnecessary wave components, such as harmonic components, of the transmission signal are suppressed by the transmission filter 11, and the transmission signal made of primarily a fundamental component is output from the antenna connection terminal Pant.

The reception signal input from the antenna connection terminal Pant is output from the reception signal output terminal Prx through the reception filter 12, the first phase shift circuit 21, and the second phase shift circuit 22. Unnecessary wave components, such as harmonic components, of the reception signal are suppressed by the reception filter 12, and the reception signal made of primarily a fundamental component is output from the reception signal output terminal Prx.

When the branching circuit is smaller in size, the distance between a transmission system and a reception system, e.g., the distance between the connection conductor 101 and the connection conductor 102, is reduced and coupling tends to occur more easily therebetween. Moreover, power of the transmission signal is greater than that of the reception signal. Accordingly, there is a possibility that the transmission signal transferred to the connection conductor 102 in the reception system cannot be sufficiently suppressed by the reception filter 12, and that the transmission signal may leak toward the reception signal output terminal Prx from the reception filter 12.

By using the configuration of the branching circuit 10 according to the present preferred embodiment, however, leakage of the transmission signal to the reception signal output terminal Prx is significantly reduced or prevented. Thus, the branching circuit 10 of this preferred embodiment has the following configuration in more detail to significantly reduce or prevent the leakage of the transmission signal.

Figure 2:
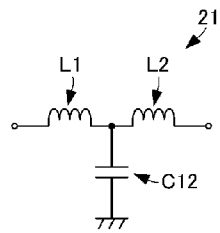
FIG. 2 illustrates an exemplary circuit configuration of a phase shift circuit used in the branching circuit according to the first preferred embodiment of the present invention.

The first phase shift circuit 21 is configured to rotate the phase of the transmission signal having passed through the reception filter 12. As illustrated in FIG. 2, for example, the first phase shift circuit 21 preferably includes inductors L1 and L2 connected in series, and a capacitor C12 connected between a junction point of the inductors L1 and L2 and a ground potential.

The first phase shift circuit 21 is configured to rotate the phase of the transmission signal having passed through the reception filter 12 such that the phase of a fundamental component of the transmission signal having passed through the reception filter 12 has a phase difference of 180° ($\pi/2$) at the predetermined point POS1 with respect to the phase of the fundamental component of the transmission signal, which is transferred to the predetermined point POS1 through the connection conductor 201, the first amplitude adjustment circuit 31, and the connection conductors 202 and 203. Such phase adjustment is realized by adjusting the inductances of the inductors and the capacitance of the capacitor, which constitute the first phase shift circuit 21.

The second phase shift circuit 22 is configured to rotate the phase of the transmission signal having passed through the first phase shift circuit 21. The second phase shift circuit 22 also preferably includes inductors and a capacitor, as illustrated in FIG. 2, similarly to the first phase shift circuit 21.

The second phase shift circuit 22 is configured to rotate the phase of the transmission signal having passed through the first phase shift circuit 21 such that the phase of a predetermined harmonic component (e.g., a tertiary harmonic component) of the transmission signal having passed through the first phase shift circuit 21 has a phase difference of 180° ($\pi/2$) at the predetermined point POS2 with respect to the phase of the predetermined harmonic component of the transmission signal, which is transferred to the predetermined point POS2 through the connection conductor 201, the first amplitude adjustment circuit 31, the connection conductor 202, the second amplitude adjustment circuit 32, and the connection conductor 204. Such phase adjustment is realized by adjusting the inductances of the inductors and the capacitance of the capacitor, which constitute the second phase shift circuit 22.

Figure 3:
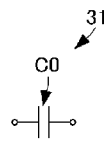
FIG. 3 illustrates an exemplary circuit configuration of an amplitude adjustment circuit included in the branching circuit according to the first preferred embodiment of the present invention.

The first amplitude adjustment circuit 31 adjusts the amplitude of the transmission signal input from the connection conductor 201. As illustrated in FIG. 3, for example, the first amplitude adjustment circuit 31 preferably includes a capacitor C0 connected to the connection conductors 201 and 202 in series.

The first amplitude adjustment circuit 31 is configured to adjust the amplitude of a fundamental component of the transmission signal such that the amplitude of the fundamental component of the transmission signal having passed through the reception filter 12 and the first phase shift circuit 21 and the amplitude of the fundamental component of the transmission signal transferred to the predetermined point POS1 through the connection conductor 201, the first amplitude adjustment circuit 31, and the connection conductors 202 and 203 are matched with each other at the predetermined point POS1. Such amplitude adjustment is realized by adjusting the capacitance of the capacitor that constitutes the first amplitude adjustment circuit 31. Here, the expression "matched" includes the case of being "substantially matched".

The second amplitude adjustment circuit 32 is configured to adjust the amplitude of the transmission signal input from the connection conductor 202 through the first amplitude adjustment circuit 31. The second amplitude adjustment circuit 32 is also configured to define a circuit including a capacitor, as illustrated in FIG. 3, similarly to the first amplitude adjustment circuit 31.

The second amplitude adjustment circuit 32 is configured to adjust the amplitude of a predetermined harmonic component of the transmission signal such that the amplitude of the predetermined harmonic component of the transmission signal having passed through the reception filter 12 and the first and second phase shift circuits 21 and 22 and the amplitude of the predetermined harmonic component of the transmission signal transferred to the predetermined point POS2 through the connection conductor 201, the first amplitude adjustment circuit 31, the connection conductor 202, the second amplitude adjustment circuit 32, and the connection conductor 204 are matched with each other at the predetermined point POS2. Such amplitude adjustment is realized by adjusting the capacitance of the capacitor that constitutes the second amplitude adjustment circuit 32. Here, the expression "matched" includes the case of being "substantially matched".

With the configuration described above, the fundamental component of the transmission signal having passed through the reception filter 12 and the first phase shift circuit 21 and the fundamental component of the transmission signal having passed through the first amplitude adjustment circuit 31 have the matched amplitude and the reversed phases at the predetermined point POS1 between the first phase shift circuit 21 and the second phase shift circuit 22. Accordingly, those two fundamental components are cancelled out.

Furthermore, the predetermined harmonic component of the transmission signal having passed through the reception filter 12 and the first and second phase shift circuits 21 and 22 and the predetermined harmonic component of the transmission signal having passed through the first and second amplitude adjustment circuits 31 and 32 have the matched amplitude and the reversed phases at the predetermined point POS2 between the second phase shift circuit and the reception signal output terminal Prx. Accordingly, those two predetermined harmonic components are cancelled out.

As a result, the transmission signal is significantly reduced or prevented from being output to the reception signal output terminal Prx. Hence, degradation of characteristics of the reception circuit in a downstream stage, connected to the reception signal output terminal Prx, is prevented.

Figure 4:
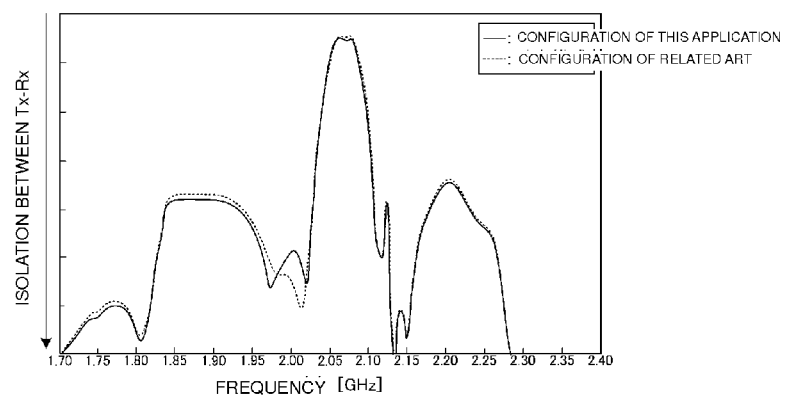
FIG. 4 is a graph plotting isolation characteristics of the branching circuit according to the first preferred embodiment of the present invention and a branching circuit of related art near a frequency band of a fundamental wave.
Figure 5:
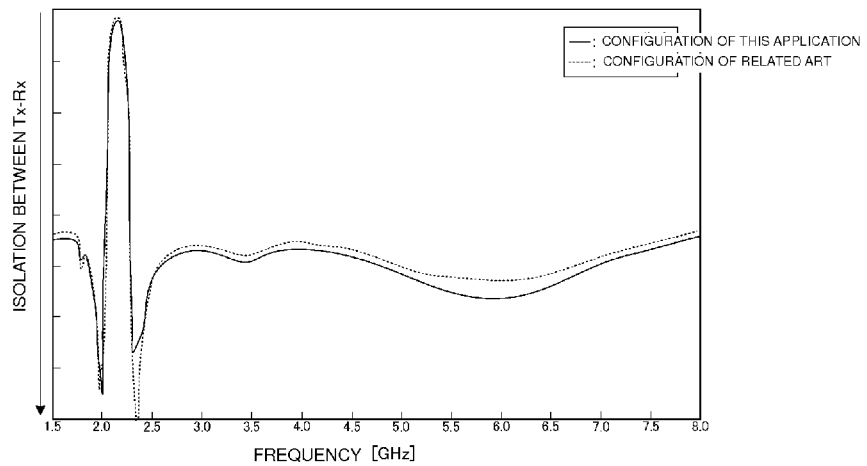
FIG. 5 is a graph plotting isolation characteristics of the branching circuit according to the first preferred embodiment of the present invention and the branching circuit of related art.

FIGS. 4 and 5 are graphs plotting isolation characteristics of the branching circuit according to the first preferred embodiment of the present invention and a branching circuit of the related art. FIG. 4 represents characteristics near a frequency (band of about 1.90 GHz) of the fundamental component of the transmission signal. FIG. 5 represents characteristics in a wide frequency band including a frequency band (about 6.0 GHz) of the predetermined harmonic component. In other words, FIGS. 4 and 5 represent isolation between the transmission signal input terminal Ptx and the reception signal output terminal Prx.

As illustrated in FIG. 4, the isolation in the frequency band (about 1.90 GHz) of the transmission signal is increased by using the configuration of this preferred embodiment. Furthermore, as illustrated in FIG. 5, the isolation in the frequency band (about 6.0 GHz) of the tertiary harmonic component the transmission signal is also increased.

While the foregoing description has been made in connection with an example of canceling out the tertiary harmonic component, the harmonic component to be cancelled out may be set to a harmonic component of another order. For example, it may be set to a harmonic component having maximum power.

Figure 6:
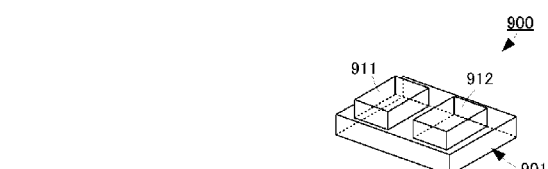
FIG. 6 is a perspective view illustrating an external appearance of an RF circuit module 900 that includes the branching circuit 10 according to the first preferred embodiment of the present invention.

The branching circuit 10 having the above-described circuit configuration preferably is an RF circuit module 900 illustrated in FIG. 6, for example. FIG. 6 is a perspective view illustrating an external appearance of the RF circuit module 900 that includes the branching circuit 10 according to the first preferred embodiment of the present invention.

The RF circuit module 900 includes a multilayer body 901. The multilayer body 901 includes a plurality of dielectric layers stacked on each other. A conductor pattern is provided on each of the dielectric layers. Mount-type filter elements 911 and 912 are mounted to a top surface of the multilayer body 901. The mount-type filter elements 911 and 912 define the transmission filter 11 and the reception filter 12, respectively.

The RF circuit module 900 including the above-described branching circuit 10 is realized with the mount-type filter elements 911 and 912, and the conductor patterns provided in the multilayer body 901. Furthermore, the first and second phase shift circuits 21 and 22 and the first and second amplitude adjustment circuits 31 and 32 are realized with the conductor patterns provided in the multilayer body 901. Any one of the first and second phase shift circuits 21 and 22 and the first and second amplitude adjustment circuits 31 and 32 may be defined by the conductor patterns inside the multilayer body 901. Alternatively, those circuits may be all defined by the conductor patterns inside the multilayer body 901. When all those circuits are not provided inside the multilayer body 901, the individual circuits may be provided by mounting components to the top surface of the multilayer body 901.

With the configuration described above, the branching circuit including a plurality of filters preferably is configured as one module. Moreover, by forming the first and second phase shift circuits 21 and 22 and the first and second amplitude adjustment circuits 31 and 32 with the conductor patterns inside the multilayer body 901, the size and the thickness of the branching circuit are significantly reduced in comparison with those in the case of forming those circuits separately and mounting them to the multilayer body 901.

Figure 7:
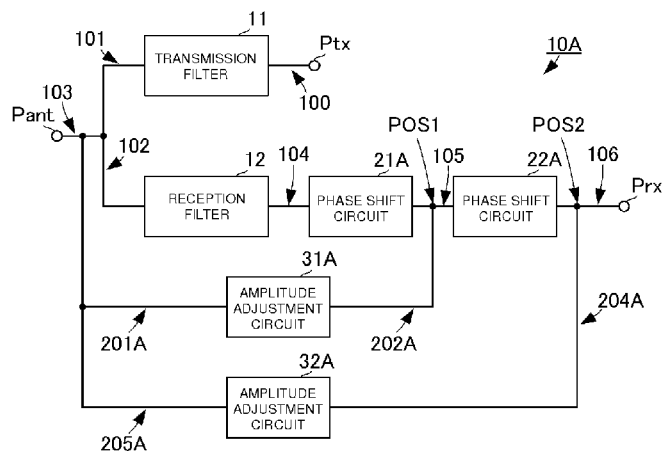
FIG. 7 is a circuit block diagram of a branching circuit 10A according to a second preferred embodiment of the present invention.

A branching circuit according to a second preferred embodiment of the present invention will be described below with reference to the drawings. FIG. 7 is a circuit block diagram of the branching circuit 10A according to the second preferred embodiment of the present invention. The branching circuit 10A of the second preferred embodiment is different from the branching circuit 10 of the first preferred embodiment in first and second amplitude adjustment circuits 31A and 32A and first and second phase shift circuits 21A and 22A. The other configuration of the branching circuit 10A is preferably the same as or substantially the same as that of the branching circuit 10 of the first preferred embodiment. Accordingly, only different points are described in detail.

The first phase shift circuit 21A and the second phase shift circuit 22A are connected between the reception filter 12 and the reception signal output terminal Prx in series in the mentioned order.

A first terminal of the first amplitude adjustment circuit 31A is connected to the connection conductor 103 through a connection conductor 201A. A second terminal of the first amplitude adjustment circuit 31A is connected to the predetermined point POS1 in the connection conductor 105 through a connection conductor 202A.

The first amplitude adjustment circuit 31A is configured to adjust the amplitude of a fundamental component of the transmission signal such that the amplitude of the fundamental component of the transmission signal having passed through the reception filter 12 and the first phase shift circuit 21A and the amplitude of the fundamental component of the transmission signal transferred to the predetermined point POS1 through the connection conductor 201A, the first amplitude adjustment circuit 31A, and the connection conductor 202A are matched with each other at the predetermined point POS1.

A first terminal of the second amplitude adjustment circuit 32A is connected to a predetermined point in the connection conductor 201A through a connection conductor 205A. A second terminal of the second amplitude adjustment circuit 32A is connected to the predetermined point POS2 in the connection conductor 106 through a connection conductor 204A.

The second amplitude adjustment circuit 32A is configured to adjust the amplitude of the predetermined harmonic component of the transmission signal such that the amplitude of the predetermined harmonic component of the transmission signal having passed through the reception filter 12 and the first and second phase shift circuits 21A and 22A and the amplitude of the predetermined harmonic component of the transmission signal transferred to the predetermined point POS2 through the connection conductor 201A, the connection conductor 205A, the second amplitude adjustment circuit 32A, and the connection conductor 204A are matched with each other at the predetermined point POS2.

The first phase shift circuit 21A is configured to rotate the phase of the transmission signal such that the phase of the fundamental component of the transmission signal having passed through the reception filter 12 and the first phase shift circuit 21A and the phase of the fundamental component of the transmission signal having passed through the connection conductor 201A, the first amplitude adjustment circuit 31A, and the connection conductor 202A are reversed relative to each other at the predetermined point POS1.

The second phase shift circuit 22A is configured to rotate the phase of the transmission signal such that the phase of the predetermined harmonic component of the transmission signal having passed through the reception filter 12 and the first and second phase shift circuits 21A and 22A, and the phase of the predetermined harmonic component of the transmission signal having passed through the connection conductor 201A, the connection conductor 205A, the second amplitude adjustment circuit 32A, and the connection conductor 204A are reversed relative to each other at the predetermined point POS2.

The above-described configuration also cancels out both the fundamental component of the transmission signal at the predetermined point POS1 and the predetermined harmonic component of the transmission signal at the predetermined point POS2. As a result, the transmission signal is significantly reduced or prevented from being output to the reception signal output terminal Prx.

Figure 8:
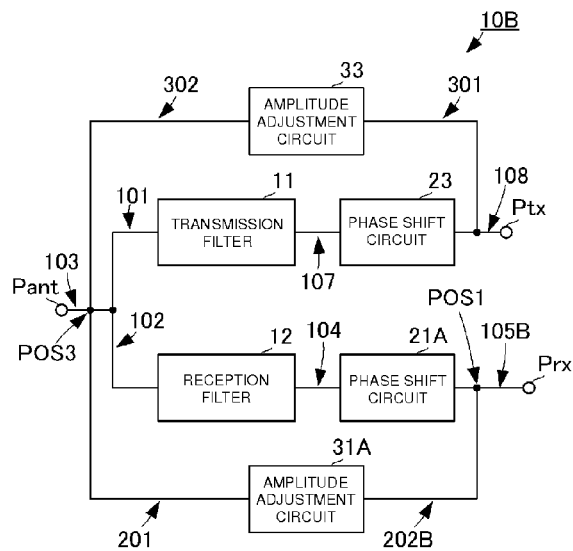
FIG. 8 is a circuit block diagram of a branching circuit 10B according to a third preferred embodiment of the present invention.

A branching circuit according to a third preferred embodiment will be described below with reference to the drawings. FIG. 8 is a circuit block diagram of the branching circuit 10B according to the third preferred embodiment of the present invention. The branching circuit 10B of the third preferred embodiment preferably is similar to the branching circuit 10 of the first preferred embodiment in configuration of the transmission signal input terminal Ptx, the reception signal output terminal Prx, the antenna connection terminal Pant, the transmission filter 11, and the reception filter 12. Furthermore, the configuration for interconnection among the transmission filter 11, the reception filter 12, and the antenna connection terminal Pant is also the same in both the branching circuits. Accordingly, only different points are described below.

The second terminal of the first phase shift circuit 21A is connected to the reception signal output terminal Prx through a connection conductor 105B.

The second terminal of the first amplitude adjustment circuit 31A is connected to a predetermined point POS1 in the connection conductor 105B through a connection conductor 202B.

The transmission signal input terminal Ptx is connected to a first terminal of a third phase shift circuit 23 through a connection conductor 108. A second terminal of the third phase shift circuit 23 is connected to the first terminal of the transmission filter 11 through a connection conductor 107.

A first terminal of a third amplitude adjustment circuit 33 is connected to the connection conductor 108 through a connection conductor 301. A second terminal of the third amplitude adjustment circuit 33 is connected to a predetermined point POS3 in the connection conductor 103 through a connection conductor 302.

The first amplitude adjustment circuit 31A is configured to adjust the amplitude of a fundamental component of the transmission signal such that the amplitude of the fundamental component of the transmission signal having passed through the reception filter 12 and the first phase shift circuit 21A and the amplitude of the fundamental component of the transmission signal transferred to the predetermined point POS1 through the connection conductor 201, the first amplitude adjustment circuit 31A, and the connection conductor 202B are matched with each other at the predetermined point POS1.

The first phase shift circuit 21A is configured to rotate the phase of the transmission signal such that the phase of the fundamental component of the transmission signal having passed through the reception filter 12 and the first phase shift circuit 21A and the phase of the fundamental component of the transmission signal having passed through the connection conductor 201, the first amplitude adjustment circuit 31A, and the connection conductor 202B are reversed relative to each other at the predetermined point POS1.

With the configuration described above, the fundamental components of the transmission signals transferred through the above-mentioned two routes are cancelled out, and the fundamental component of the transmission signal is significantly reduced or prevented from being output to the reception signal output terminal Prx. Each of the fundamental component and the predetermined harmonic component is significantly reduced or prevented by adjusting circuit element values of the first phase shift circuit 21A and the first amplitude adjustment circuit 31A.

The third phase shift circuit 23 is configured to rotate the phase of the transmission signal such that the phase of the predetermined harmonic component of the transmission signal having passed through the third phase shift circuit 23, the connection conductor 107, the transmission filter 11, and the connection conductors 101 and 103 and the phase of the predetermined harmonic component of the transmission signal having passed through the connection conductor 301, the third amplitude adjustment circuit 33, and the connection conductor 302 are reversed relative to each other at the predetermined point POS3.

The third amplitude adjustment circuit 33 is configured to adjust the amplitude of the transmission signal such that the amplitude of the predetermined harmonic component of the transmission signal having passed through the connection conductor 301, the third amplitude adjustment circuit 33, and the connection conductor 302 and the amplitude of the predetermined harmonic component of the transmission signal having passed through the third phase shift circuit 23, the connection conductor 107, the transmission filter 11, and the connection conductors 101 and 103 are substantially matched with each other at the predetermined point POS3.

With the configuration described above, the predetermined harmonic component having been not fully suppressed by the transmission filter 11 is cancelled out at the predetermined point POS3 before the antenna connection terminal Pant. Thus, the harmonic component of the transmission signal is prevented from being output (transmitted) to the outside from the antenna connection terminal Pant. In addition, when the third phase shift circuit 23 rotates the phase of the transmission signal such that the phase of the fundamental component of the transmission signal having passed through the third phase shift circuit 23, the connection conductor 107, the transmission filter 11, and the connection conductors 101 and 103 and the phase of the fundamental component of the transmission signal having passed through the connection conductor 301, the third amplitude adjustment circuit 33, and the connection conductor 302 are the same, power of the fundamental component of the transmission signal output from the antenna connection terminal Pant is significantly increased. In other words, transmission efficiency is greatly improved.

In the above-described configuration, the third phase shift circuit 23 and the third amplitude adjustment circuit 33 may be additionally configured to include the following functions.

The third phase shift circuit 23 is configured to rotate the phase of the reception signal such that the phase of a predetermined frequency component (e.g., a fundamental component) of the reception signal having passed through the connection conductors 103 and 101, the transmission filter 11, the connection conductor 107, the third phase shift circuit 23, and the connection conductor 108 and the phase of the predetermined frequency component (e.g., the fundamental component) of the reception signal having passed through the connection conductor 302, the third amplitude adjustment circuit 33, and the connection conductor 301 are reversed relative to each other at a junction point between the connection conductor 108 and the connection conductor 301.

The third amplitude adjustment circuit 33 is configured to adjust the amplitude of the reception signal such that the amplitude of the predetermined frequency component (e.g., the fundamental component) of the reception signal having passed through the connection conductor 302, the third amplitude adjustment circuit 33, and the connection conductor 301 and the amplitude of the predetermined frequency component (e.g., the fundamental component) of the reception signal having passed through the connection conductors 103 and 101, the transmission filter 11, the connection conductor 107, the third phase shift circuit 23, and the connection conductor 108 are substantially matched with each other at a junction point between the connection conductor 108 and the connection conductor 301.

With the configuration described above, the fundamental components of the reception signals transferred through the above-mentioned two routes are cancelled out at the junction point between the connection conductor 108 and the connection conductor 301. Accordingly, the fundamental component of the reception signal is significantly reduced or prevented from being output to the transmission signal input terminal Ptx.

Figure 9:
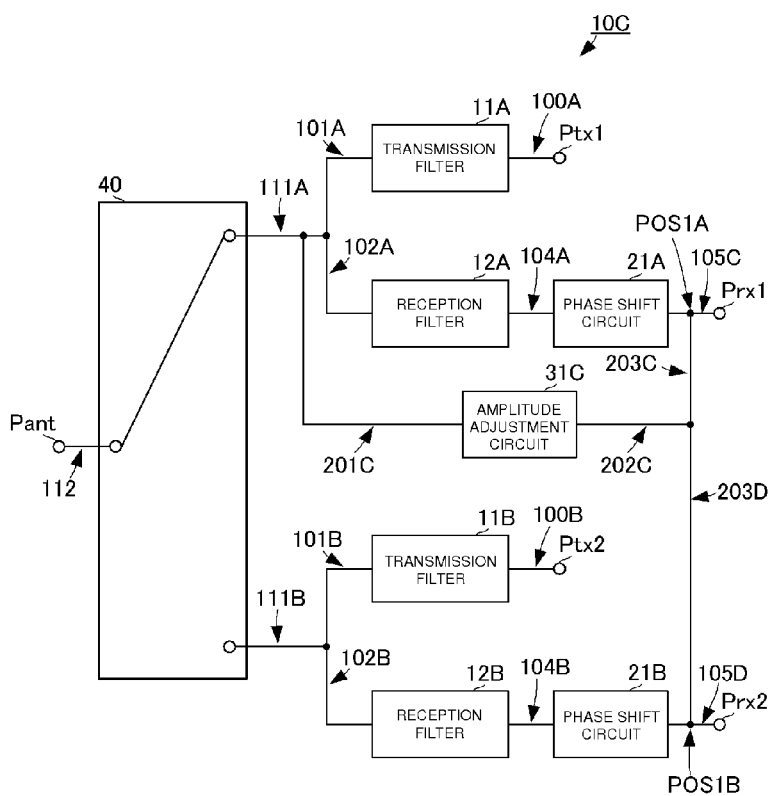
FIG. 9 is a circuit block diagram of a branching circuit 10C according to a fourth preferred embodiment of the present invention.

A branching circuit according to a fourth preferred embodiment of the present invention will be described below with reference to the drawings. FIG. 9 is a circuit block diagram of the branching circuit 10C according to the fourth preferred embodiment of the present invention. The branching circuit 10C of this preferred embodiment preferably includes two pairs of transmission filters and reception filters, and two pairs of transmission signal input terminals and reception signal output terminals Prx.

The branching circuit 10C includes a transmission signal input terminal Ptx1 that corresponds to a "first input/output terminal", a reception signal output terminal Prx1 that corresponds to a "second input/output terminal", a transmission signal input terminal Ptx2 that corresponds to a "fourth input/output terminal", a reception signal output terminal Prx2 that corresponds to a "fifth input/output terminal", and an antenna connection terminal Pant that corresponds to a "seventh input/output terminal". The branching circuit 10C further includes a transmission filter 11A that corresponds to a "first filter", a reception filter 12A that corresponds to a "second filter", a transmission filter 11B that corresponds to a "third filter", and a reception filter 12B that corresponds to a "fourth filter". The branching circuit 10C still further includes a first phase shift circuit 21A, a fourth phase shift circuit 21B, and a fourth amplitude adjustment circuit 31C. The first phase shift circuit 21A and the fourth phase shift circuit 21B correspond to a "phase shift circuit". The fourth amplitude adjustment circuit 31C corresponds to an "amplitude adjustment circuit".

The transmission signal input terminal Ptx1 is connected to a first terminal of the transmission filter 11A by a connection conductor 100A. A second terminal of the transmission filter 11A is connected to a first separate terminal (corresponding to a "third input/output terminal") of a switch element 40 by connection conductors 101A and 111A.

A junction point between the connection conductor 101A and the connection conductor 111A is connected to a first terminal of the reception filter 12A by a connection conductor 102A. A second terminal of the reception filter 12A is connected to a first terminal of the first phase shift circuit 21A by a connection conductor 104A. A second terminal of the first phase shift circuit 21A is connected to the reception signal output terminal Prx1 by a connection conductor 105C.

The transmission signal input terminal Ptx2 is connected to a first terminal of the transmission filter 11B by a connection conductor 100B. A second terminal of the transmission filter 11B is connected to a second separate terminal (corresponding to a "sixth input/output terminal") of the switch element 40 by connection conductors 101B and 111B.

A junction point between the connection conductor 101B and the connection conductor 111B is connected to a first terminal of the reception filter 12B by a connection conductor 102B. A second terminal of the reception filter 12B is connected to a first terminal of the fourth phase shift circuit 21B by a connection conductor 104B. A second terminal of the fourth phase shift circuit 21B is connected to the reception signal output terminal Prx2 by a connection conductor 105D.

The switch element 40 is operated to connect one of the first separate terminal and the second separate terminal to a common terminal in accordance with a control signal. The common terminal is connected to the antenna connection terminal Pant by a connection conductor 112.

The connection conductor 111A is connected at its predetermined point to a first terminal of the fourth amplitude adjustment circuit 31C by a connection conductor 201C. A second terminal of the fourth amplitude adjustment circuit 31C is connected to a predetermined point POS1A in the connection conductor 105C by connection conductors 202C and 203C. The second terminal of the fourth amplitude adjustment circuit 31C is further connected to a predetermined point POS1B in a connection conductor 105D by connection conductors 202C and 203D.

The transmission filter 11A preferably is configured, for example, by connecting a plurality of SAW filters in series or in parallel. The transmission filter 11A is configured such that a frequency band of a first transmission signal (corresponding to a "first communication signal") falls within a pass band of the transmission filter 11A, and that respective frequency bands of a first reception signal (corresponding to a "second communication signal"), a second transmission signal (corresponding to a "third communication signal"), and a second reception signal (corresponding to a "fourth communication signal") fall within an attenuation band of the transmission filter 11A.

The reception filter 12A is also preferably configured, for example, by connecting a plurality of SAW filters in series or in parallel. The reception filter 12A is configured such that the frequency band of the first reception signal falls within a pass band of the reception filter 12A, and that the respective frequency bands of the first transmission signal, the second transmission signal, and the second reception signal fall within an attenuation band of the reception filter 12A.

Similarly, the transmission filter 11B is preferably configured, for example, by connecting a plurality of SAW filters in series or in parallel. The transmission filter 11B is configured such that the frequency band of the second transmission signal falls within a pass band of the transmission filter 11B, and that the respective frequency bands of the first transmission signal, the first reception signal, and the second reception signal fall within an attenuation band of the transmission filter 11B.

The reception filter 12B is preferably configured, for example, by connecting a plurality of SAW filters in series or in parallel. The reception filter 12B is configured such that the frequency band of the second reception signal falls within a pass band of the reception filter 12B, and that the respective frequency bands of the first transmission signal, the first reception signal, and the second transmission signal fall within an attenuation band of the reception filter 12B.

In the branching circuit 10C having the above-described configuration, the first and second transmission signals and the first and second reception signals are basically transferred as follows.

In the case of transmitting the first transmission signal and receiving the first reception signal, the common terminal and the first separate terminal of the switch element 40 are connected to each other.

The first transmission signal input from the transmission signal input terminal Ptx1 is output from the antenna connection terminal Pant through the transmission filter 11A and the switch element 40. Unnecessary wave components, such as harmonic components, of the first transmission signal are suppressed by the transmission filter 11A, and the first transmission signal made of primarily a fundamental component is output from the antenna connection terminal Pant.

The first reception signal input from the antenna connection terminal Pant is output from the reception signal output terminal Prx1 through the switch element 40, the reception filter 12A, and the first phase shift circuit 21A. Unnecessary wave components, such as harmonic components, of the first reception signal are suppressed by the reception filter 12A, and the first reception signal made of primarily a fundamental component is output from the reception signal output terminal Prx1.

In the case of transmitting the second transmission signal and receiving the second reception signal, the common terminal and the second separate terminal of the switch element 40 are connected to each other.

The second transmission signal input from the transmission signal input terminal Ptx2 is output from the antenna connection terminal Pant through the transmission filter 11B and the switch element 40. Unnecessary wave components, such as harmonic components, of the second transmission signal are suppressed by the transmission filter 11B, and the second transmission signal made of primarily a fundamental component is output from the antenna connection terminal Pant.

The second reception signal input from the antenna connection terminal Pant is output from the reception signal output terminal Prx2 through the switch element 40, the reception filter 12B, and the fourth phase shift circuit 21B. Unnecessary wave components, such as harmonic components, of the second reception signal are suppressed by the reception filter 12B, and the second reception signal primarily including a fundamental component is output from the reception signal output terminal Prx2.

In the configuration described above, respective characteristics of the first phase shift circuit 21A, the fourth phase shift circuit 21B, and the fourth amplitude adjustment circuit 31C are set as follows.

The first phase shift circuit 21A is configured to rotate the phase of the first transmission signal having passed through the reception filter 12A. The first phase shift circuit 21A preferably includes, for example, two inductors connected in series, and a capacitor connected between a junction point of those two inductors and a ground potential.

The first phase shift circuit 21A is configured to rotate the phase of the first transmission signal having passed through the reception filter 12A such that the phase of the fundamental component of the first transmission signal having passed through the reception filter 12A has a phase difference of 180° ($\pi/2$) at the predetermined point POS1A with respect to the phase of the fundamental component of the first transmission signal, which is transferred to the predetermined point POS1A through the connection conductor 201C, the fourth amplitude adjustment circuit 31C, and the connection conductors 202C and 203C. Such phase adjustment is realized by adjusting the inductances of the inductors and the capacitance of the capacitor, which constitute the first phase shift circuit 21A.

The fourth phase shift circuit 21B is configured to rotate the phase of the first transmission signal having leaked in the switch element 40 or through magnetic coupling between the connection conductors 111A and 111B, and having passed through the reception filter 12B. The fourth phase shift circuit 21B preferably includes, for example, two inductors connected in series, and a capacitor connected between a junction point of those two inductors and a ground potential.

The fourth phase shift circuit 21B is configured to rotate the phase of the first transmission signal having passed through the reception filter 12B such that the phase of the fundamental component of the first transmission signal having passed through the reception filter 12B has a phase difference of 180° ($\pi/2$) at the predetermined point POS1B with respect to the phase of the fundamental component of the transmission signal, which is transferred to the predetermined point POS1B through the connection conductor 201C, the fourth amplitude adjustment circuit 31C, and the connection conductors 202C and 203D. Such phase adjustment is realized by adjusting the inductances of the inductors and the capacitance of the capacitor, which constitute the fourth phase shift circuit 21B.

The fourth amplitude adjustment circuit 31C is configured to adjust the amplitude of the first transmission signal input through the connection conductor 201C. The fourth amplitude adjustment circuit 31C preferably includes, for example, a capacitor connected to the connection conductors 201C and 202C in series.

The fourth amplitude adjustment circuit 31C is configured to adjust the amplitude of the fundamental component of the first transmission signal such that the amplitude of the fundamental component of the first transmission signal having passed through the reception filter 12A and the first phase shift circuit 21A and the amplitude of the fundamental component of the first transmission signal transferred to the predetermined point POS1A through the connection conductor 201C, the fourth amplitude adjustment circuit 31C, and the connection conductors 202C and 203C are matched with each other at the predetermined point POS1A.

In addition, the fourth amplitude adjustment circuit 31C is configured to adjust the amplitude of the fundamental component of the first transmission signal such that the amplitude of the fundamental component of the first transmission signal having passed through the reception filter 12B and the fourth phase shift circuit 21B and the amplitude of the fundamental component of the first transmission signal transferred to the predetermined point POS1B through the connection conductor 201C, the fourth amplitude adjustment circuit 31C, and the connection conductors 202C and 203D are matched with each other at the predetermined point POS1B.

Such amplitude adjustment is realized by adjusting the capacitance of the capacitor that constitutes the fourth amplitude adjustment circuit 31C. The distances from the second terminal of the transmission filter 11A to the predetermined points POS1A and POS1B are different from each other. It is therefore not easy to accurately adjust the amplitudes at both the predetermined points. In view of such a point, an intermediate amplitude between the amplitude of the first transmission signal at the predetermined point POS1A after having passed through the reception filter 12A and the amplitude of the first transmission signal at the predetermined point POS1B after having passed through the reception filter 12B preferably is set for adjustment.

With the configuration described above, the fundamental component of the first transmission signal having passed through the reception filter 12A and the first phase shift circuit 21A and the fundamental component of the first transmission signal having passed through the fourth amplitude adjustment circuit 31C have the matched amplitude and the reversed phases at the predetermined point POS1A. Accordingly, those two fundamental components are cancelled out.

Furthermore, the fundamental component of the first transmission signal having passed through the reception filter 12B and the fourth phase shift circuit 21B and the fundamental component of the first transmission signal having passed through the fourth amplitude adjustment circuit 31C have the matched amplitude and the reversed phases at the predetermined point POS1B. Accordingly, those two fundamental components are cancelled out.

As a result, the first transmission signal is significantly reduced or prevented from being output to the reception signal output terminals Prx1 and Prx2.

Moreover, with the configuration of this preferred embodiment, since one amplitude adjustment circuit is shared by the two pairs of the transmission filters and the reception filters, the amplitude adjustment circuit is not needed to be disposed for each pair of the transmission filter and the reception filter. Hence, the branching circuit has a much simpler configuration.

Figure 10:
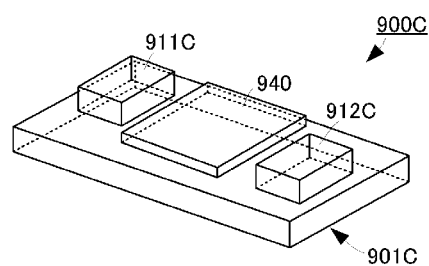
FIG. 10 is a perspective view illustrating an external appearance of an RF circuit module 900C that includes the branching circuit 10C according to the fourth preferred embodiment of the present invention.

The branching circuit 10C having the above-described circuit configuration preferably is an RF circuit module 900C illustrated in FIG. 10, for example. FIG. 10 is a perspective view illustrating an external appearance of the RF circuit module 900C that includes the branching circuit 10C according to the fourth preferred embodiment of the present invention.

The RF circuit module 900C includes a multilayer body 901C. The multilayer body 901C includes a plurality of dielectric layers stacked on each other. A conductor pattern is provided on each of the dielectric layers. Mount-type duplexer elements 911C and 912C and a switch IC 940 are mounted to a top surface of the multilayer body 901C. The mount-type duplexer element 911C provides the pair of the transmission filter 11A and the reception filter 12A. The mount-type duplexer element 912C provides the pair of the transmission filter 11B and the reception filter 12B.

The RF circuit module 900C including the above-described branching circuit 10C preferably is realized with the mount-type duplexer elements 911C and 912C, the switch IC 940, and the conductor patterns provided in the multilayer body 901C. Furthermore, the first and fourth phase shift circuits 21A and 21B and the fourth amplitude adjustment circuit 31C are realized with the conductor patterns provided in the multilayer body 901C. Any one of the first and fourth phase shift circuits 21A and 21B and the fourth amplitude adjustment circuit 31C may be provided by the conductor patterns inside the multilayer body 901C. Alternatively, those circuits may be all defined by the conductor patterns inside the multilayer body 901C. When all those circuits are not provided inside the multilayer body 901C, the individual circuits may be provided by mounting components to the top surface of the multilayer body 901C.

With the configuration described above, the branching circuit including a plurality of duplexers preferably are configured by one module. Moreover, by defining the first and fourth phase shift circuits 21A and 21B and the fourth amplitude adjustment circuit 31C with the conductor patterns inside the multilayer body 901C, the size and the thickness of the branching circuit is significantly reduced in comparison with those in the case of forming those circuits separately and mounting them to the multilayer body 901C. The size and the thickness of the branching circuit are further reduced by sharing the amplitude adjustment circuit with a plurality of duplexers, particularly, as in this preferred embodiment.

While the above preferred embodiments have been described in connection with an example of selectively connecting plural pairs of transmission filters and reception filters (i.e., plural duplexers) to the antenna connection terminal Pant through the switch element 40, the above-described configuration of the phase shift circuits and the amplitude adjustment circuit can also be applied to the case where plural pairs of transmission filters and reception filters (i.e., plural duplexers) are connected to the antenna connection terminal Pant through another branching circuit including inductors and a capacitor.

In addition, the above-described preferred embodiments can be combined with each other, and the configuration of a branching circuit in combination of the above-described preferred embodiments also provide the above-described operating advantages corresponding to the combined preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching circuit comprising:
a first filter connected between a first input/output terminal and a third input/output terminal and having a pass band that corresponds to a frequency band of a first communication signal;
a second filter connected between a second input/output terminal and the third input/output terminal and having a pass band that corresponds to a frequency band of a second communication signal, the pass band of the first filter and the pass band of the second filter being different from each other;
a phase shift circuit connected in series to a terminal of the second filter at a side closer to the second input/output terminal; and
an amplitude adjustment circuit connected between a terminal of the second filter at a side closer to the third input/output terminal and a terminal of the phase shift circuit at a side closer to the second input/output terminal in parallel to the second filter and the phase shift circuit; wherein
the phase shift circuit is configured to rotate a phase of a fundamental component and/or a predetermined harmonic component of the first communication signal leaking from the second filter to be reversed relative to a phase of the first communication signal having passed through the amplitude adjustment circuit at a junction point between the amplitude adjustment circuit and the phase shift circuit;
the amplitude adjustment circuit is configured to execute amplitude adjustment such that an amplitude of the first communication signal output from the amplitude adjustment circuit and an amplitude of the first communication signal output from the phase shift circuit are matched with each other at the junction point between the amplitude adjustment circuit and the phase shift circuit; and
the phase shift circuit includes a first phase shift circuit configured to adjust the phase of the fundamental component, and a second phase shift circuit configured to adjust the phase of the predetermined harmonic component, the first phase shift circuit and the second phase shift circuit being connected in series.

2. The branching circuit according to claim 1, wherein the amplitude adjustment circuit includes a first amplitude adjustment circuit and a second amplitude adjustment circuit, which are connected in series.

3. The branching circuit according to claim 1, wherein the amplitude adjustment circuit includes a first amplitude adjustment circuit and a second amplitude adjustment circuit, which are connected in parallel.

4. The branching circuit according to claim 1, further comprising:
a third phase shift circuit connected between the first filter and the first input/output terminal; and
a third amplitude adjustment circuit connected in series between a terminal of the third phase shift circuit at a side closer to the first input/output terminal and a terminal of the first filter at a side closer to the third input/output terminal.

5. The branching circuit according to claim 1, further comprising:
a third filter connected between a fourth input/output terminal and a sixth input/output terminal and having a pass band that corresponds to a frequency band of a third communication signal;
a fourth filter connected between a fifth input/output terminal and the sixth input/output terminal and having a pass band that corresponds to a frequency band of a fourth communication signal; and
a fourth phase shift circuit connected between the fourth filter and the fifth input/output terminal; wherein
the third input/output terminal and the sixth input/output terminal are connected directly or indirectly;

a terminal of the amplitude adjustment circuit at a side closer to the second input/output terminal is connected to a predetermined point between the fourth phase shift circuit and the fifth input/output terminal;

the fourth phase shift circuit is configured to rotate a phase of the first communication signal leaking from the fourth filter to be reversed relative to the phase of the first communication signal having passed through the amplitude adjustment circuit at the predetermined point between the fourth phase shift circuit and the fifth input/output terminal; and the amplitude adjustment circuit is configured to execute amplitude adjustment such that the amplitude of the first communication signal output from the amplitude adjustment circuit and an amplitude of the first communication signal output from the fourth phase shift circuit are matched with each other at the predetermined point between the fourth phase shift circuit and the fifth input/output terminal.

6. The branching circuit according to claim 5, further comprising a switch configured to selectively connect the third input/output terminal and the sixth input/output terminal to a seventh input/output terminal.

7. An RF circuit module comprising:
the circuit configuration according to claim 1;
a multilayer body including conductor patterns therein; and
a component mounted to the multilayer body; wherein
the amplitude adjustment circuit and the phase shift circuit are each defined by at least one of the component and the conductor patterns in the multilayer body.

8. The RF circuit module according to claim 7, wherein the amplitude adjustment circuit includes a first amplitude adjustment circuit and a second amplitude adjustment circuit, which are connected in series.

9. The RF circuit module according to claim 7, wherein the amplitude adjustment circuit includes a first amplitude adjustment circuit and a second amplitude adjustment circuit, which are connected in parallel.

10. The RF circuit module according to claim 7, further comprising:
a third phase shift circuit connected between the first filter and the first input/output terminal; and
a third amplitude adjustment circuit connected in series between a terminal of the third phase shift circuit at a side closer to the first input/output terminal and a terminal of the first filter at a side closer to the third input/output terminal.

11. The RF circuit module according to claim 7, further comprising:
a third filter connected between a fourth input/output terminal and a sixth input/output terminal and having a pass band that corresponds to a frequency band of a third communication signal;
a fourth filter connected between a fifth input/output terminal and the sixth input/output terminal and having a pass band that corresponds to a frequency band of a fourth communication signal; and
a fourth phase shift circuit connected between the fourth filter and the fifth input/output terminal; wherein
the third input/output terminal and the sixth input/output terminal are connected directly or indirectly;
a terminal of the amplitude adjustment circuit at a side closer to the second input/output terminal is connected to a predetermined point between the fourth phase shift circuit and the fifth input/output terminal;
the fourth phase shift circuit is configured to rotate a phase of the first communication signal leaking from the fourth filter to be reversed relative to the phase of the first communication signal having passed through the amplitude adjustment circuit at the predetermined point between the fourth phase shift circuit and the fifth input/output terminal; and
the amplitude adjustment circuit is configured to execute amplitude adjustment such that the amplitude of the first communication signal output from the amplitude adjustment circuit and an amplitude of the first communication signal output from the fourth phase shift circuit are matched with each other at the predetermined point between the fourth phase shift circuit and the fifth input/output terminal.

12. The RF circuit module according to claim 11, further comprising a switch configured to selectively connect the third input/output terminal and the sixth input/output terminal to a seventh input/output terminal.

13. A branching circuit comprising:
a first filter connected between a first input/output terminal and a third input/output terminal and having a pass band that corresponds to a frequency band of a first communication signal;
a second filter connected between a second input/output terminal and the third input/output terminal and having a pass band that corresponds to a frequency band of a second communication signal, the pass band of the first filter and the pass band of the second filter being different from each other;
a first phase shift circuit and a second phase shift circuit connected in series to a terminal of the second filter at a side closer to the second input/output terminal; and
a first amplitude adjustment circuit and a second amplitude adjustment circuit connected in series to each other and connected between a terminal of the second filter at a side closer to the third input/output terminal and a terminal of the second phase shift circuit at a side closer to the second input/output terminal in parallel to the second filter; wherein
a junction point between the first amplitude adjustment circuit and the second amplitude adjustment circuit is connected to a junction point between the first phase shift circuit and the second phase shift circuit;
the first phase shift circuit is configured to rotate a phase of at least a fundamental component of the first communication signal leaking from the second filter to be reversed relative to a phase of the first communication signal having passed through the first amplitude adjustment circuit at a junction point between the first amplitude adjustment circuit and the first phase shift circuit;
the second phase shift circuit is configured to rotate a phase of a predetermined harmonic component of the first communication signal leaking from the second filter to be reversed relative to a phase of the first communication signal having passed through the second amplitude adjustment circuit at a junction point between the second amplitude adjustment circuit and the second phase shift circuit;
the first amplitude adjustment circuit is configured to execute amplitude adjustment such that an amplitude of the fundamental component of the first communication signal output from the first amplitude adjustment circuit and an amplitude of the fundamental component of the first communication signal output from the first phase shift circuit are matched with each other at the junction point between the first amplitude adjustment circuit and the first phase shift circuit; and the second amplitude adjustment circuit executes amplitude adjustment such that an amplitude of the predetermined harmonic component of the first communication signal output from the second amplitude adjustment circuit and an amplitude of the predetermined harmonic component of the first communication signal output from the second phase shift circuit are matched with each other at the junction point between the second amplitude adjustment circuit and the second phase shift circuit.

14. An RF circuit module comprising:
the circuit configuration according to claim 13;
a multilayer body including conductor patterns therein; and
a component mounted to the multilayer body; wherein
the first amplitude adjustment circuit, the second amplitude adjustment circuit, the first phase shift circuit, and the second phase shift circuit are each defined by at least one of the mount-type component or the conductor patterns in the multilayer body.

15. A branching circuit comprising:
a first filter connected between a first input/output terminal and a third input/output terminal and having a pass band that corresponds to a frequency band of a first communication signal;
a second filter connected between a second input/output terminal and the third input/output terminal and having a pass band that corresponds to a frequency band of a second communication signal, the pass band of the first filter and the pass band of the second filter being different from each other;
a first phase shift circuit and a second phase shift circuit connected in series to a terminal of the second filter at a side closer to the second input/output terminal;
a first amplitude adjustment circuit connected in series between a terminal of the second filter at a side closer to the third input/output terminal and a terminal of the first phase shift circuit at a side closer to the second phase shift circuit; and
a second amplitude adjustment circuit connected in series between the terminal of the second filter at a side closer to the third input/output terminal and a terminal of the second phase shift circuit at a side closer to the second input/output terminal; wherein the first phase shift circuit is configured to rotate a phase of at least a fundamental component of the first communication signal leaking from the second filter to be reversed relative to a phase of the first communication signal having passed through the first amplitude adjustment circuit at a junction point between the first amplitude adjustment circuit and the first phase shift circuit;

the second phase shift circuit is configured to rotate a phase of a predetermined harmonic component of the first communication signal leaking from the second filter to be reversed relative to a phase of the first communication signal having passed through the second amplitude adjustment circuit at a junction point between the second amplitude adjustment circuit and the second phase shift circuit;

the first amplitude adjustment circuit is configured to execute amplitude adjustment such that an amplitude of the fundamental component of the first communication signal output from the first amplitude adjustment circuit and an amplitude of the fundamental component of the first communication signal output from the first phase shift circuit are matched with each other at the junction point between the first amplitude adjustment circuit and the first phase shift circuit; and the second amplitude adjustment circuit is configured to execute amplitude adjustment such that an amplitude of the predetermined harmonic component of the first communication signal output from the second amplitude adjustment circuit and an amplitude of the predetermined harmonic component of the first communication signal output from the second phase shift circuit are matched with each other at the junction point between the second amplitude adjustment circuit and the second phase shift circuit.

16. An RF circuit module comprising:
the circuit configuration according to claim 15;
a multilayer body including conductor patterns therein; and
a component mounted to the multilayer body; wherein
the first amplitude adjustment circuit, the second amplitude adjustment circuit, the first phase shift circuit, and the second phase shift circuit are each defined by at least one of the mount-type component or the conductor patterns in the multilayer body.

* * * * *